United States Patent [19]

Boettcher

[11] 4,069,475
[45] Jan. 17, 1978

[54] MOS DYNAMIC RANDOM ACCESS MEMORY HAVING AN IMPROVED SENSE AND RESTORE CIRCUIT

[75] Inventor: Charles E. Boettcher, Saratoga, Calif.

[73] Assignee: National Semiconductor Corporation, Santa Clara, Calif.

[21] Appl. No.: 677,463

[22] Filed: Apr. 15, 1976

[51] Int. Cl.² ............. G11C 7/06; G11C 11/24; G11C 11/40
[52] U.S. Cl. .................... 365/205; 365/203; 365/208; 365/149
[58] Field of Search ............. 340/173 FF, 173 CA; 307/238

[56] References Cited
U.S. PATENT DOCUMENTS

| 3,760,381 | 9/1973 | Yao | 340/173 CA |
| 3,992,704 | 11/1976 | Kantz | 340/173 CA |
| 4,003,035 | 1/1977 | Hoffman et al. | 340/173 CA |
| 4,004,284 | 1/1977 | Heeren | 340/173 FF |
| 4,004,285 | 1/1977 | Bormann et al. | 340/173 CA |

Primary Examiner—Stuart N. Hecker
Attorney, Agent, or Firm—Gail W. Woodward; Willis E. Higgins

[57] ABSTRACT

In a memory circuit, first and second bit line portions, each having a plurality of memory cells coupled thereto as provided for reading and writing electrical potentials into and out of the coupled memory cells. A bistable flip-flop type sensing amplifier is coupled between the first and second bit portion for sensing the voltage difference therebetween and for latching into one of the two states in response to sensing either a "0" or a "1" accessed to one of the bit line portions from an addressed memory cell to be read out of the memory. A high input impedance amplifier is provided between the respective bit line portion and the respective input terminal of the sensing amplifier for isolating (buffering) the stray capacitance of the sensing amplifier circuit from the capacitance of its bit line. Switchable restore circuitry bypasses each of the isolating line amplifiers for the purposes of restoring electrical potentials read out of the addressed memory cells. The restore timing signals for controlling the restore circuitry is derived from one of the outputs of the flip-flop sense amplifier so that the restore circuitry is self-timing and in addition power dissipation of the circuit is reduced because the time during which the bistable flip-flop draws signal current through the ON side thereof is reduced.

4 Claims, 5 Drawing Figures

U.S. Patent   Jan. 17, 1978   Sheet 1 of 2   4,069,475
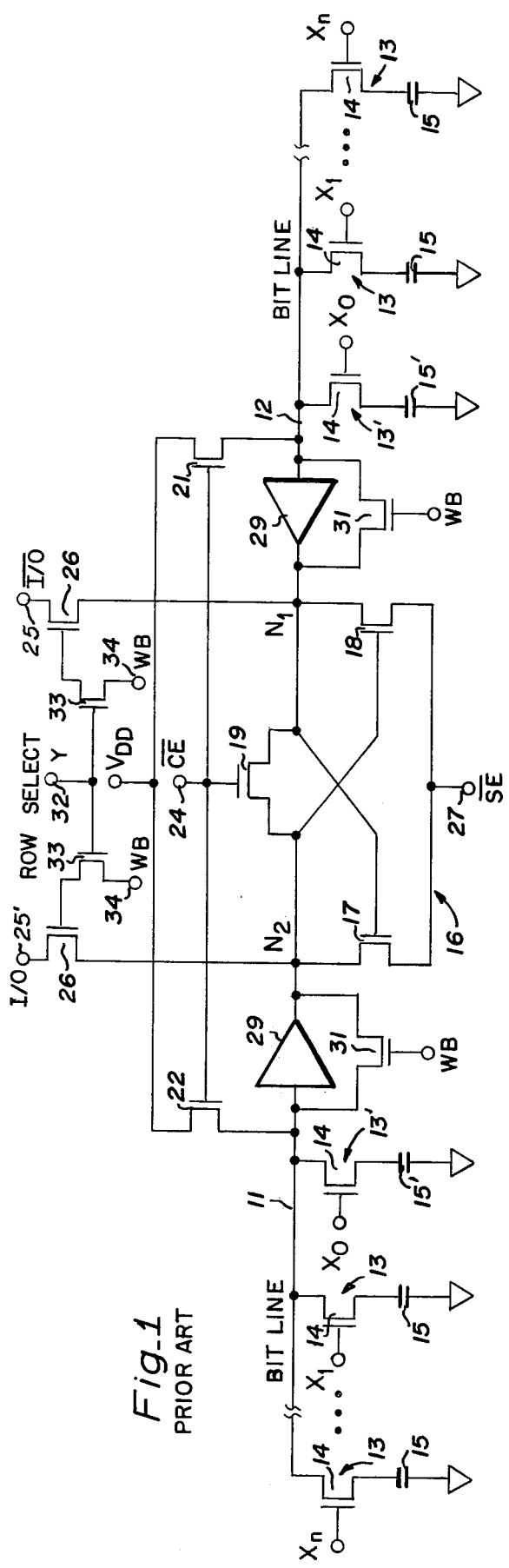
Fig_1
PRIOR ART
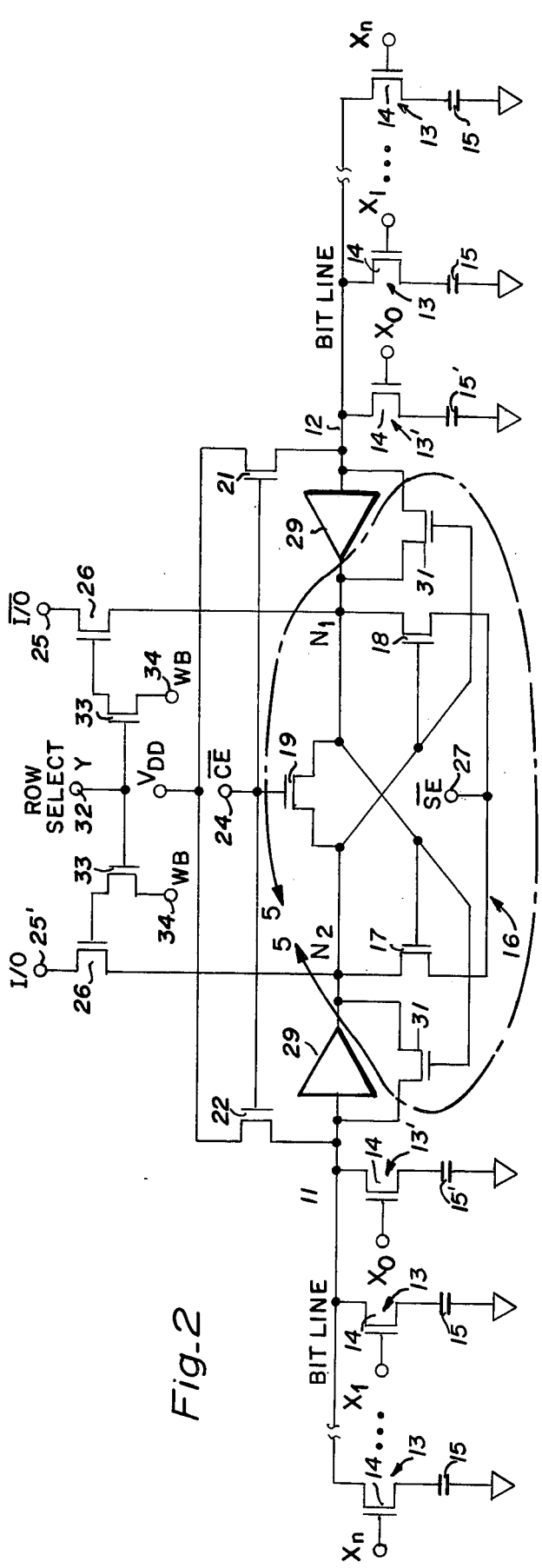
Fig_2

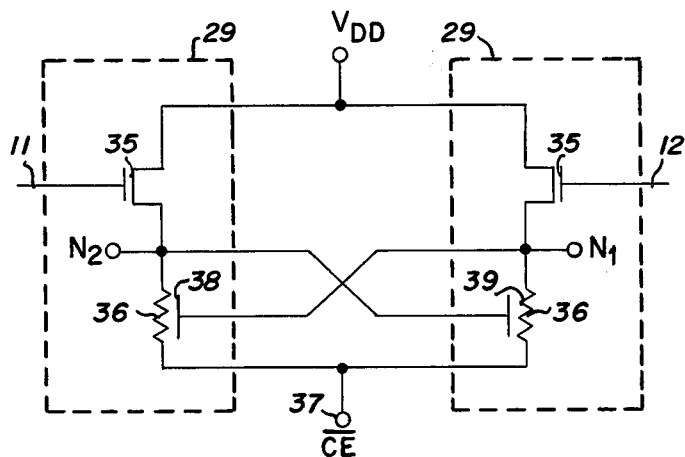
Fig_3
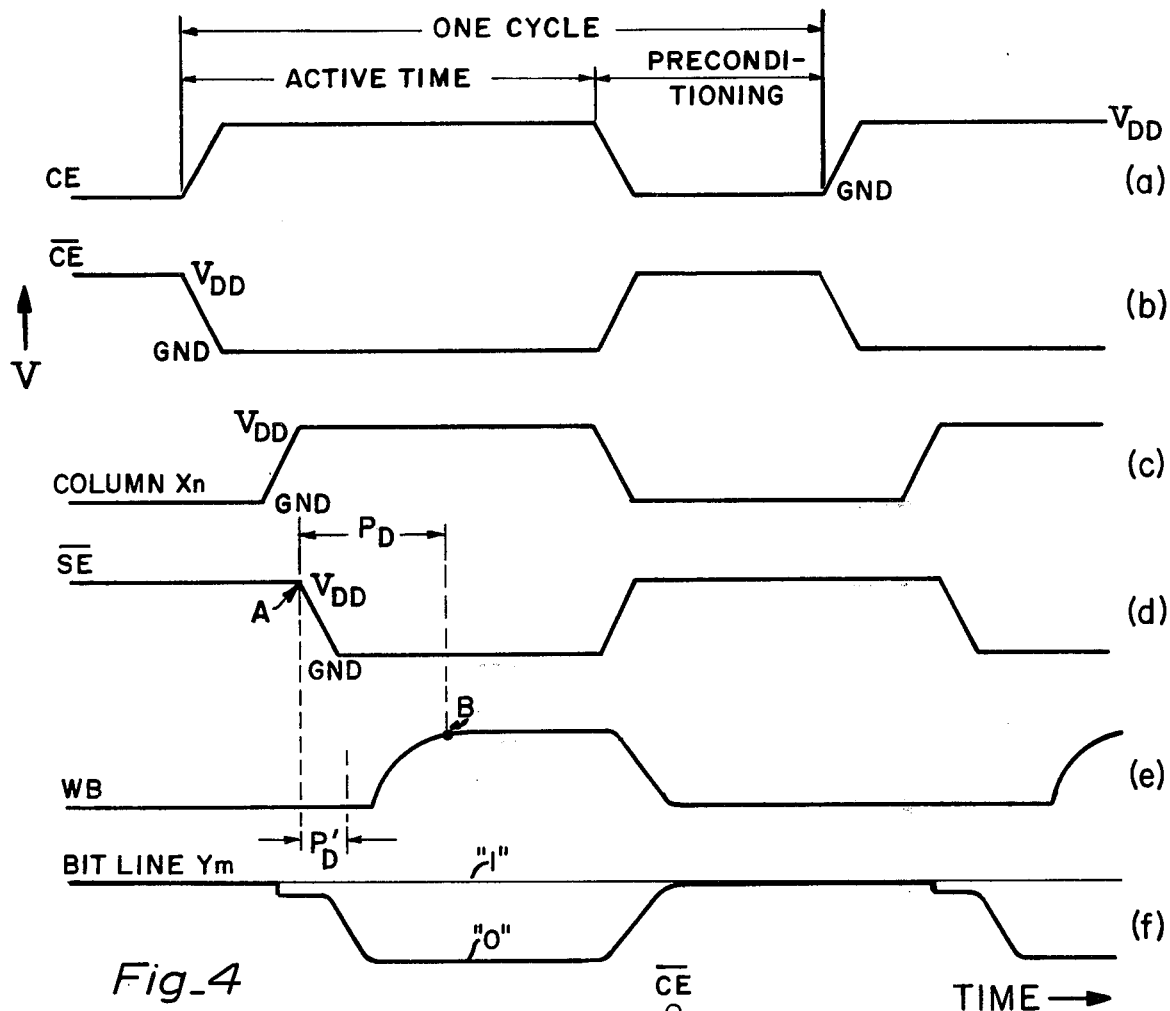
Fig_4
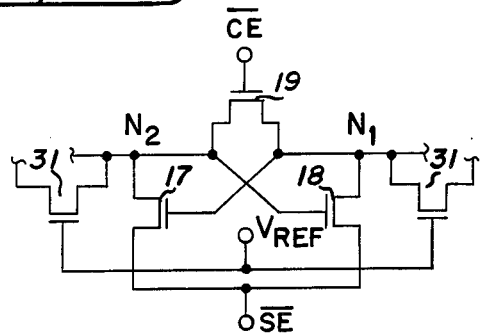
Fig_5

MOS DYNAMIC RANDOM ACCESS MEMORY HAVING AN IMPROVED SENSE AND RESTORE CIRCUIT

RELATED CASES

The provision of buffer line amplifiers interfacing the flip-flop sense amplifier to the first and second halves of the bit line is disclosed and claimed in copending U.S. application Ser. No. 677,462 filed Apr. 15, 1976 and assigned to the same assignee as the present invention.

BACKGROUND OF THE INVENTION

The present invention relates in general to MOS dynamic random access memories and more particularly to such memories employing single transistor memory cells selectively coupled onto a bit line for reading out of and writing into an addressed one of the memory cells.

DESCRIPTION OF THE PRIOR ART

Heretofore, as disclosed in the aforecited related case, U.S. Ser. No. 677,462, MOS dynamic random access memories have employed a matrix of single transistor memory cells with each row or column of the cells being coupled to two halves of a bit line. A flip-flop sensing amplifier has been employed for sensing the voltage difference between the potential on the two halves of the bit line resulting from a sharing of the charge read from a reference cell onto one half of the bit line and sharing of the charge read from an addressed one of the storge cells on the other half of the bit line. Buffer line amplifiers have been provided for isolating the capacitance of the sense amplifier from the capacitance of each of the halves of the bit line. To restore the electrical signals read out of the memory cells, the line amplifier circuits have been bypassed by switchable restore circuitry responsive to a timing restore signal generated after the sense amplifier has latched into a stable state.

A problem with this type of prior art memory is that the ON side of the flip-flop circuit draws current therethrough and thus accounts for power dissipation of the circuit from a time beginning with energization of the sense amplifier to a time at which the restore timing signal reaches full amplitude.

It would be desirable to reduce this power dissipation of the sense amplifier circuit and to eliminate the requirement for producing the separate restore timing signal for actuation of the restore bypass circuitry for bypassing the buffer line amplifiers.

SUMMARY OF THE PRESENT INVENTION

The principal object of the present invention is the provision of an improved MOS dynamic random access memory.

In one feature of the present invention, restore timing signals for actuation of the restore bypass circuitry for bypassing the buffer line amplifiers, which interface the bit line portions to the bistable sensing amplifier, are derived from the bistable sensing amplifier when the bistable sense amplifier has switched sufficiently to exceed the turn-on threshold of the corresponding restore bypass switch. This permits a reduction in the power dissipation of the sense amplifier and in some instances eliminates the requirement for generation of a separate restore timing signal.

Other features and advantages of the present invention will become apparent upon a perusal of the following specification taken in connection with the accompanying drawings wherein:

BRIEF DESCRIPTION OF THE DRAWINGS

FIG. 1 is a schematic circuit diagram of one row of single transistor random access memory matrix incorporating features of the prior art, FIG. 2 is a schematic circuit diagram similar to that of FIG. 1, incorporating features of the present invention, FIG. 3 is a schematic diagram of the bit line buffer amplifiers of FIGS. 1 and 2, FIG. 4 is a timing diagram depicting various waveforms found in the circuits of FIGS. 1 and 2, and FIG. 5 is an alternative embodiment to that portion of the circuit of FIG. 2 delineated by line 5—5.

DESCRIPTION OF THE PREFERRED EMBODIMENTS

Referring now to FIG. 1 there is shown one row of a prior art dynamic MOS single transistor random access memory matrix. More particularly, the row circuit includes first and second bit line portions 11 and 12 for providing electrical communication to a plurality of individual single transistor memory cells 13 coupled to the bit line portions 11 and 12, respectively.

Each memory cell 13 includes a switching transistor 14 and a storage capacitor 15 for storing electrical potentials representative of "0s" or "1s". A first one of the storage cells 13' on each bit line portion 11 and 12 which is closest to the center of the two combined bit line portions 11 and 12 has its storage capacitor 15' selected of a certain predetermined capacitance relative to the capacitance of the other memory cell capacitors 15 to act as a reference storage cell. All the other storage cells 13 which are coupled to each of the bit lines 11 and 12 serve for storing information to be stored and read out of the memory matrix. Each of the storage capacitors 15, including the reference capacitors 15', is selectively switched in to electrically conductive relation with the respective bit line portions 11 and 12 via the switching transistors 14. The gates of the switching transistors 14 are connected to column address lines $X_0$, $X_1 \ldots X_n$. In a typical example of a 64×64 memory matrix, $n$ is 32 so that there are 32 active memory cells 13 coupled to each bit line portion 11 and 12 in each of 64 rows of the memory matrix.

The inner end of each bit line portion 11 and 12 is connected to a sensing node $N_1$ or $N_2$ forming the pair of input terminals of a bistable sensing amplifier circuit 16. The bistable sensing amplifier 16 comprises a transistorized flip-flop circuit formed by transistors 17 and 18. A transistor switch 19 is connected between the nodes $N_1$ and $N_2$ for equalizing the charge therebetween during precharging of the respective bit line portions 11 and 12. Similarly, transistors 21 and 22 are provided for switching a precharging potential of approximately +12 volts at $V_{DD}$ onto each of the bit line portions 11 and 12. The precharging potential is switched on to each of the bit line portions 11 and 12 via a chip enable signal $\overline{CE}$ applied at terminal 24 which serves to turn on the precharging switching transistors 21 and 22 as well as the equalizing transistor switch 19.

A pair of buffer line amplifiers 29 are provided between each of the inner ends of the respective bit lines 11 and 12 and the corresponding sense amplifier nodes $N_1$ and $N_2$. Input/output and row select circuitry is connected directly to nodes $N_1$ and $N_2$. Writeback or restore circuitry has been provided for bypassing the respective buffer line amplifiers 29 for restoring electrical potentials into the respective addressed memory cells 13. Switching transistors 31 are connected for bypassing each of the buffer line amplifiers 29, such switching transistors 31 being turned on by a writeback potential WB applied to the gate of the respective restore switching transistors 31. The row select address signal Y is applied to row select input terminal 32 which in turn turns on switching transistors 33 when the writeback potential WB is applied at terminals 34 of the switching transistors 33. When the row select switching transistors 33 are turned on, they serve to turn on input/output switching transistors 26 for connecting input/output terminals 25 and 25' to the respective nodes $N_1$ and $N_2$ for inputting and outputting data to the row memory element.

In operation, the row of memory cells is preconditioned by charging both bit line portions 11 and 12 to a predetermined precharging potential, such as $V_{DD}$, by turning on switches 19, 21 22, and 31. The precharging potential thereby charges the stray capacitance of both bit line portions 11 and 12 to the same potential. After the bit line portions 11 and 12 have been precharged, the precharging switches 19, 21, 22, and 31 are turned off and a selected one of the memory cells 13 is switched onto the respective bit line portion 11 or 12 via energization of one of the column select lines $X_1$-$X_n$. This serves to address the particular memory cell to be read out onto the respective bit line.

Concurrently, one of the reference cells 13' is addressed by the addressing circuit for switching that reference cell which is on the opposite bit line portion, to the cell being read out, onto its respective bit line portion. The reference storage capacitor 15' has previously been precharged to a predetermined level and the capacitance of the reference storage capacitor 15' is chosen relative to the capacitance of the nonreference storage capacitor 15 so that when the reference cell is switched onto the corresponding bit line portion the charge is shared with the bit line capacitance in such a manner that the corresponding bit line establishes a potential approximately midway between that of a "0" and a "1" as produced by a nonreference storage cell 13. When the charge is shared between a nonreference memory cell and the corresponding bit line portion, the bit line portion assumes a potential closer to a "1" or a "0" than that of the reference side of the composite bit line.

The sense amplifier 16 is enabled by applying the sense enable potential $\overline{SE}$ to terminal 27 which turns on the flip-flop sense amplifier 16. The buffer line amplifiers are turned on by $\overline{CE}$ going to ground which occurs prior to actuation of the sense amplifier 16. The buffer line amplifiers 29 apply their outputs to respective nodes $N_1$ and $N_2$ and the sense amplifier 16 amplifies the small voltage difference appearing between nodes $N_1$ and $N_2$ as derived from the corresponding bit line portions 12 and 11. The flip-flop sense amplifier 16 drives the nodes $N_1$ and $N_2$ to the opposite extreme of the available potential, namely if $N_1$ remains at electrical potential $V_{DD}$ (an electrical "1"), node $N_2$ will be driven to the potential of an electrical "0" ($\overline{SE}$) or ground potential.

The waveforms (a), (b) (c) (d), (e), and (f) of FIG. 4 correspond to the corresponding operating waveforms in the circuit of FIG. 1. After the sense amplifier 16 has latched to its stable state, upon sensing of the voltage difference between bit line portions 11 and 12 as appearing at the output of amplifiers 29 on nodes $N_1$ and $N_2$, the output is read out by enabling the input/output switching transistors 26 via the row select potential Y and the writeback signal WB. Writeback signal WB also actuates writeback bypass switching transistors 31 for writing back the potential on nodes $N_1$ and $N_2$ to the respective bit line portions 12 and 11.

A problem with the prior art circuit of FIG. 1 is that the sense amplifier 16 draws significant current from a time beginning with switching of the sense $\overline{SE}$ signal from the $V_{DD}$ potential to ground potential (see point A of waveform (d) of FIG. 4) until the writeback WB signal has switched to a fully positive potential of $V_{DD}$ at point B. This results in a significant power drain indicated by $P_D$ on waveform (d). Furthermore, it would be desirable to eliminate the requirement for the generation of a separate timing writeback signal WB, shown in waveform (e).

Accordingly, the circuit of FIG. 2 shows an improved circuit which is substantially the same as that of FIG. 1 with the exception that the gates of the bypass switching or restore transistors 31 are connected to the opposite nodes $N_2$ and $N_1$ of the sense amplifier 16.

The advantage to connection of the switching bypass transistors 31 to the nodes $N_1$ and $N_2$ is that the sense amplifier 16 automatically generates the desired timing signals for switching of the restore bypass transistors 31. In addition, the sensing amplifier 16 dissipates power only from the time the sense enable signal $\overline{SE}$ is taken to ground until the flip-flop sense amplifier 16 has amplified the difference signals on nodes $N_1$ and $N_2$ sufficiently to turn on the bypass or restore switches 31. This is shown $P_D'$ in waveform (f) of FIG. 4.

Although the circuit of FIG. 2 is shown with the same row select and input/output circuitry as that of the prior art of FIG. 1, this is not a requirement and other input/output circuitry may be employed which does not require the generation of the writeback signal WB. In this latter case, the requirement for the generation of the WB timing signal is entirely eliminated.

Referring now to FIG. 3, there is shown the circuit for the two source follower buffer line amplifiers 29. More particularly, each amplifier includes a transistor 35 with its source and drain series connected with a resistive load transistor 36 between the source of $V_{DD}$ potential and the complement of the chip enable potential $\overline{CE}$ as applied at terminal 37. The respective output signals, derived across the load transistors 36, appear at nodes $N_1$ and $N_2$. The output signal from node $N_1$ is applied to the gate 38 of the opposite load transistor, whereas the signal developed on node $N_2$ is applied to the gate 39 of the $N_1$ node load transistor 36. This cross-coupling of the gates to the opposite nodes $N_1$ and $N_2$ serves to conserve power by turning off the power in both amplifiers 29 when the sense amplifier 16 latches into the stable state.

Referring now to FIG. 5, there is shown an alternative embodiment to that part of the circuit of FIG. 2 delineated by line 5—5 for generating the restore timing signals automatically from a state of the sense amplifier 16. More particularly, the gates of the restore switches 31 are connected to a reference source of potential $V_{REF}$ at, for example, $V_{DD}-2V_T$, where $V_T$ is the turn threshold voltage of the switching transistors 31. In operation, the potential on $N_1$ and $N_2$ will determine which restore switching transistor 31 will be turned on when the sense amplifier starts to latch into one of its stable states as shown in waveform (f) of FIG. 4.

What is claimed is:

1. In a memory circuit:
   bit line means having first and second portions over which electrical potentials representative of data to be stored in the memory are sensed and restored;
   memory cell means for storing the electrical potentials representative of data to be read therefrom and restored thereto in use;
   switch means for electrically coupling the electrical potentials, representative of the stored and restored data, between said bit line means and said memory cell means in response to address signals applied to said switch means;
   sense amplifier means coupled between said first and second portions of said bit line means for sensing the difference in electrical potential therebetween generated in response to the electrical potential read from one of said addressed memory cell means onto one of said first and second portions of said bit line means;
   buffer line amplifier means coupled between said sense ammplifier means and said bit line means for isolating the capacitance of said sense amplifier means from said bit line means;
   restore circuit means interconnecting said sense amplifier and a first one of said portions of said bit line means and being disposed in bypassing relation to a first one of said buffer line amplifier means for selectively bypassing electrical signals from said sense amplifier means back around said first buffer line amplifier means to said first portion of said bit line means for restoring an electrical potential read out of one of said addressed memory cells, said restore circuit means including first restore switch means responsive to a restore timing signal for selectively rendering said first switch means conductive for bypassing said first buffer line amplifier means through said first restore circuit means; and
   means for deriving said restore timing signal from an electrical state of said sense amplifier means.

2. The apparatus of claim 1 wherein said sense amplifier means includes a bistable flip-flop circuit means having first and second terminals on which the two output potentials representative of the two stable electrical potential states of said flip-flop means are established, said first terminal of said flip-flop means being connected to receive as an input the electrical potential of said first bit line portion means, said second terminal of said flip-flop means being connected to said first restore switch means such that the electrical signal on said second terminal of said flip-flop means serves as the restoring timing signal for controlling the switching action of said first restore switch means.

3. The apparatus of claim 2 including second buffer line amplifier means interconnecting said second bit line portion means and said second terminal means of said bistable flip-flop circuit means for receiving electrical signals inputted from said second bit line portion means, second restore circuit means connected between said second terminal means of said sense amplifier means and said second bit line portion means and being connected in bypassing relation to said second buffer line amplifier means, said second restore circuit means including a second restore switch means responsive to a second restore timing signal for rendering said second restore circuit means conductive for bypassing restore signals to said second bit line portion means around said second buffer line amplifier means, and said first terminal means of said bistable flip-flop means being connected to said second restore switch means for providing said second restore timing signal to said second restore switch means.

4. The apparatus of claim 1 wherein said sense amplifier means includes a bistable flip-flop circuit means having first and second terminals on which the two output potentials representative of the two stable electrical potential states of said flip-flop means are established, said first terminal of said flip-flop means being connected to receive as an input the electrical potential of said first bit line portion means, said first terminal of said flip-flop means being connected to said first restore switch means such that the electrical signal on said first terminal of said flip-flop means serves as the restoring timing signal for controlling the switching action of said first restore switch means.

* * * * *